United States Patent
Wong et al.

(10) Patent No.: US 7,656,240 B2
(45) Date of Patent: Feb. 2, 2010

(54) LOW VOLTAGE SYNCHRONOUS OSCILLATOR FOR DC-DC CONVERTER

(75) Inventors: Yat To Wong, Ocean Shores (HK); David Chik Wai Ng, Kowloon (HK); Kam Chuen Wan, Shan King Est (HK); David Kwok Kuen Kwong, Fremont, CA (US)

(73) Assignee: Hong Kong Applied Science and Technology Research Institute Co., Ltd., Hong Kong (CN)

( * ) Notice: Subject to any disclaimer, the term of this patent is extended or adjusted under 35 U.S.C. 154(b) by 142 days.

(21) Appl. No.: 11/869,616

(22) Filed: Oct. 9, 2007

(65) Prior Publication Data

US 2009/0091399 A1    Apr. 9, 2009

(51) Int. Cl.
*H03K 3/03* (2006.01)

(52) U.S. Cl. .................. 331/57; 331/1 A; 327/166; 327/176

(58) Field of Classification Search ............ 331/1 A, 331/57; 327/166, 176, 258, 259, 291
See application file for complete search history.

(56) References Cited

U.S. PATENT DOCUMENTS

| | | | | |
|---|---|---|---|---|
| 4,560,954 A | * | 12/1985 | Leach | 331/108 B |
| 5,977,809 A | * | 11/1999 | Wang et al. | 327/239 |
| 6,094,081 A | * | 7/2000 | Yanagiuchi | 327/258 |
| 6,362,694 B1 | * | 3/2002 | Doberenz | 331/57 |
| 6,396,250 B1 | | 5/2002 | Bridge | |
| 6,603,291 B2 | | 8/2003 | Wheeler et al. | |
| 6,900,682 B2 | * | 5/2005 | Truong et al. | 327/259 |
| 7,006,364 B2 | | 2/2006 | Jin et al. | |

OTHER PUBLICATIONS

Behzard Razari, "Design of Analog CMOS Integrated Circuits," Chapter 14, 14.2 Ring Oscillators, pp. 484-486, Jul. 2000.
Gabriel A Shau, IEEE Transactions on Power Electronics, vol. 19, No. 2, "A Low Voltage, Dynamic, Noninverting. Synchronous Buck-Boost Converter for Portable Applications," Mar. 2004, p. 443.
C.Y. Leung et al., IEEE Journal of Solid-State Circuits, vol. 40, No. 11, A 1-V Integrated Current-Mode Boost Converter in Standard 3.3/5-V CMOS Technologies, Nov. 2005, pp. 2265-2275.

* cited by examiner

*Primary Examiner*—Joseph Chang
*Assistant Examiner*—Jeffrey Shin
(74) *Attorney, Agent, or Firm*—Fulbright & Jaworski L.L.P.

(57) ABSTRACT

Systems and methods which provide an oscillator circuit outputting non-overlapping trigger signals throughout a range of operating voltages using a reset-set (RS) flip-flop type circuit configuration are shown. Embodiments utilize output driver buffers internal to the RS flip-flop circuit configuration to provide oscillator feedback delay. Feedback control circuitry may be implemented to ensure that the delay associated with any one driver buffer does not solely provide the feedback delay. Embodiments further implement input delay circuitry adapted to maintain a relatively constant reset and set input feedback delay ratio throughout a large range of operating conditions.

21 Claims, 7 Drawing Sheets

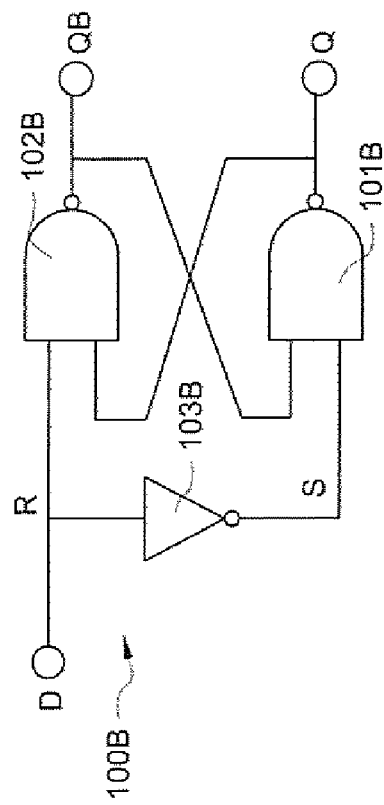
FIG. 1A
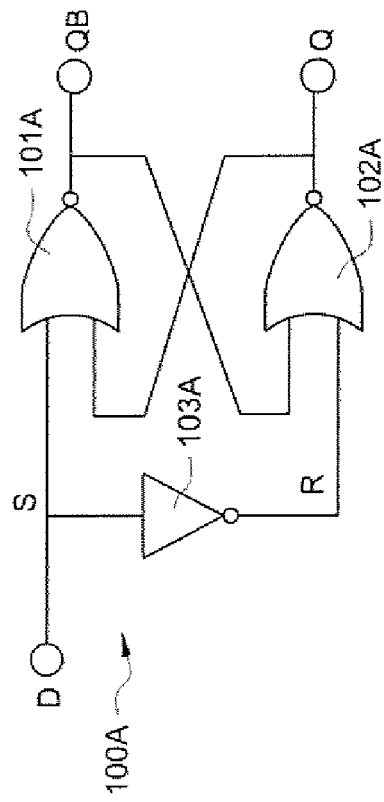
FIG. 1B
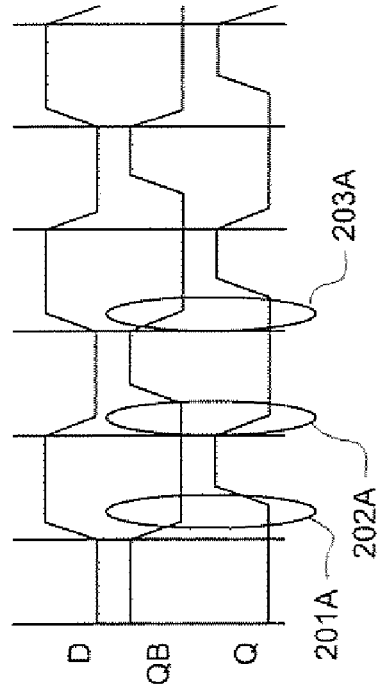
FIG. 2A
FIG. 2B

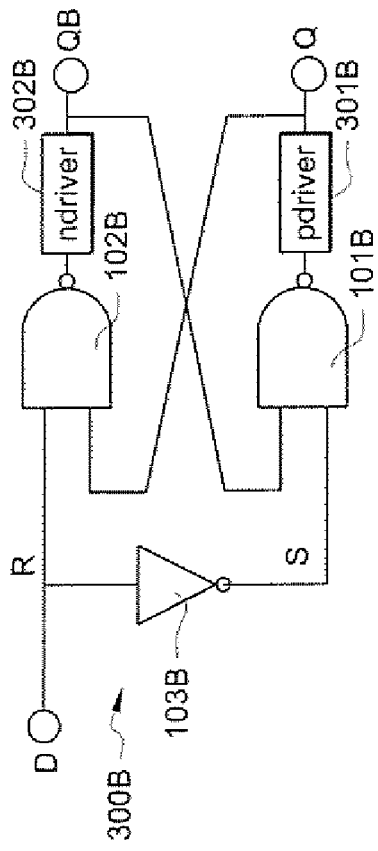
FIG. 3A
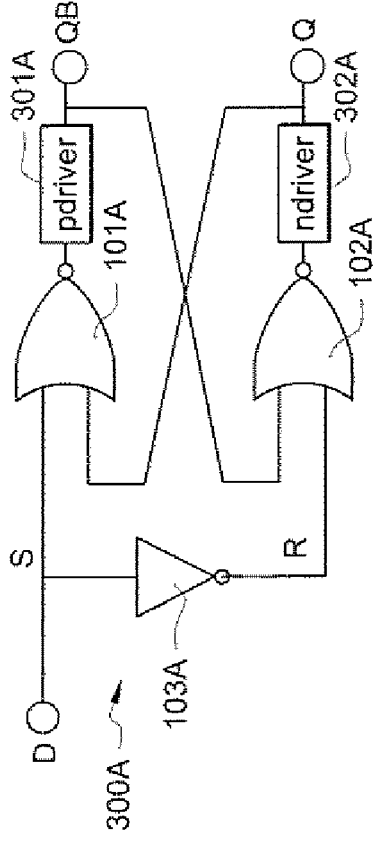
FIG. 3B
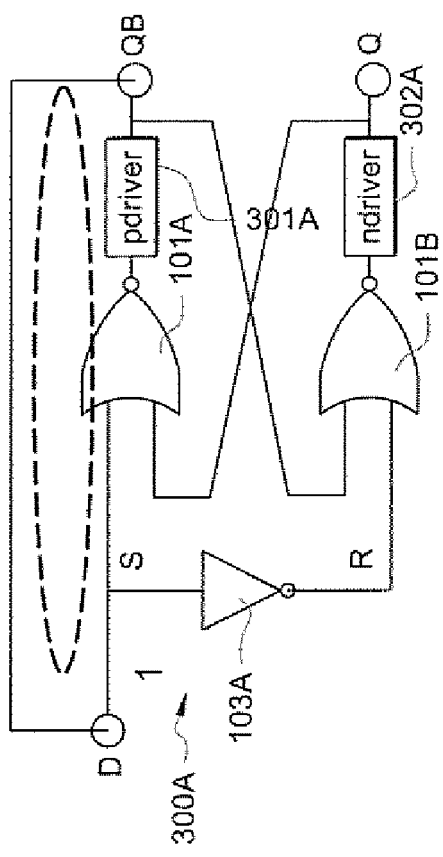
FIG. 4A
FIG. 4B

LOW VOLTAGE SYNCHRONOUS OSCILLATOR FOR DC-DC CONVERTER

TECHNICAL FIELD

The present invention relates generally to oscillator circuits and, more particularly, to oscillator circuits useful in DC-DC converter applications.

BACKGROUND OF THE INVENTION

Electronic devices used for personal and business purposes have become ubiquitous. For example, many persons use personal computers, calculators, entertainment systems, and telephones in their personal and professional lives everyday. Many such electronic devices are portable, and thus include an independent power supply, such as in the form of a battery or batteries.

Batteries used as the foregoing power supplies provide a direct current (DC) source. Commercially available batteries are generally provided in various configurations having predetermined capacities and output voltages. Often times, a battery must be used which provides a DC output voltage different than that required by one or more circuits of an electronic device the battery is to power. For example, some commercially available batteries may provide an output voltage which is too high whereas some commercially available batteries may provide an output voltage which is too low, while no commercially available battery provides an output voltage which is exactly that required by a circuit of a particular electronic device. Similarly, due to such considerations as size (e.g., for enhanced portability), a small form-factor battery may be utilized with respect to an electronic device, although that particular battery does not provide an output voltage required by circuits of the electronic device. Further aggravating this mismatch of battery output voltage to electronic device circuit voltage requirements is the fact that all such batteries tend to suffer voltage sag (decreased voltage output) with time and/or use. Accordingly, even where the output voltage of a battery initially meets circuit voltage requirements, the output voltage of the battery will not likely continue to meet the circuit voltage as the electronic device sees use.

Accordingly, various circuits have been developed to provide DC-DC voltage conversion, such as to increase the output voltage of a commercially available battery (e.g., 1.5 Volt output of a typical AA dry-cell battery) to a voltage sufficient to reliably operate common transistor logic circuits (e.g., 3.3 Volts). For example, DC-DC converters may use a pair of switches (e.g., transistors) to controllably switch current provided from a DC source for converting the source voltage to a higher voltage. In order to prevent there being a short to ground (i.e., "short circuit"), the trigger signals controlling these switches should be synchronous such that both switches are not on (i.e., conducting current) at the same time. Accordingly, such DC-DC voltage conversion circuits have generally employed an oscillator circuit to provide trigger signals for use in producing the desired voltage conversion. See B. Sahu, Gabriel A. and Rincón-Mora "A Low Voltage, Dynamic, Noninverting, Synchronous Buck-Boost Converter for Portable Applications," IEEE Transactions On Power Electronics, Vol. 19, No. 2, p. 443, March 2004, C. Y. Leung, P. K. T. Mok and K. N. Leung, "A 1-V Integrated Current-Mode Boost Converter in Standard 3.3/5-V CMOS Technologies," IEEE Journal of Solid-State Circuits, Vol. 40, No. 11, pp. 2265-2274, November 2005, U.S. Pat. No. 6,603,291 to Wheeler et al., U.S. Pat. No. 6,396,250 to Bridge, and U.S. Pat. No. 7,006,364 to Jin et al., the disclosures of which are incorporated herein by reference, for examples of DC-DC voltage conversion circuits employing oscillator circuits.

The oscillators that have heretofore been available for use in DC-DC converters have not been ideal. For example, some previous oscillator configurations implement a fixed delay to provide non-overlapping trigger signal output. The oscillators shown in the above referenced papers entitled "A Low Voltage, Dynamic, Noninverting, Synchronous Buck-Boost Converter for Portable Applications" and "A 1-V Integrated Current-Mode Boost Converter in Standard 3.3/5-V CMOS Technologies" and above referenced U.S. Pat. No. 6,603,291, implement such fixed delays. However, it has been found that such delays, although fixed in the sense that they are not controllably adjustable, are not in fact fixed in the operating environment. For example, the delays are effected by changes in the operating voltage (e.g., power supply voltage sag), by operating temperatures, etc. For example, a "fixed" delay may be 10 nsec at an expected operating voltage of 3.3 Volts, but may increase to 100 nsec at 1 Volt and 200 nsec at 0.6 Volts, for example, such that the delay becomes dominating and the DC-DC converters cannot be reliably switched any longer. The use of mixed circuitry (e.g., analog and digital circuits) aggravates the foregoing problems. As the delays provided in the oscillator circuit change, the trigger signal output becomes asynchronous, resulting in overlapping trigger signal output and failure of the DC-DC converter.

Oscillators implementing programmable delays have been introduced in an attempt to address the foregoing problems. The oscillators shown in above referenced U.S. Pat. No. 6,396,250 implements such programmable delays. These oscillators are typically very complicated, employing both analog and digital circuits, consume appreciable physical space, and are not easily implemented. Moreover, if the programmable delay is in error (e.g., the models used in predicting the needed delay are inaccurate, there are differences introduced to the circuit through integrated circuit process variations, etc.) the trigger signal output may be asynchronous, resulting in overlapping trigger signal output and failure of the DC-DC converter.

To address the foregoing problems, many previous oscillator configurations implement one or more delay tuning circuits. The oscillators shown in above referenced U.S. Pat. No. 7,006,364 implement such delay tuning circuits. Although such tuning circuits may be somewhat effective in controlling delay in response to variations in operating conditions, such as changes in operating voltage, the use of such circuits is not without disadvantage. For example, the delay tuning circuits are typically complicated and add cost, complexity, and physical size to the DC-DC converters. The complexity of delay tuning circuits can result in integrated circuit process variations producing inoperable or unpredictable circuits. Moreover, delay tuning circuits often implement voltage sensors which are ineffective at low voltages (e.g., 0.8 Volts) and thus cannot be used to provide reliable and accurate voltage conversion through much of many battery's life cycle. Such limits on low voltage operation is particularly problematic in the startup of boost or buck-boost DC-DC converter circuits where higher voltages provided by the converter are not available. Additionally, although operating to control delays to maintain non-overlapping trigger signal output, such delay tuning circuits often do not maintain a constant duty cycle with respect to the trigger signal output, and thus the DC-DC converter voltage output is not constant.

BRIEF SUMMARY OF THE INVENTION

The present invention is directed to systems and methods which provide an oscillator circuit outputting non-overlapping trigger signals throughout a range of operating voltages using a reset-set (RS) flip-flop type circuit configuration. Embodiments of the invention utilize output driver buffers internal to the RS flip-flop circuit configuration to provide oscillator feedback delay, and thus provide a self-oscillating circuit configuration. Feedback control circuitry is preferably implemented to ensure that the delay associated with any one driver buffer does not solely provide the feedback delay. Accordingly, control circuitry of embodiments provides feedback control such that the signal being fed back propagates through each of a plurality of output driver buffers and thus the oscillator circuit continues to provide non-overlapping trigger signal output throughout a large range of operating voltages. Embodiments of the invention farther implement input delay circuitry adapted to maintain a relatively constant reset and set input feedback delay ratio throughout the foregoing large range of operating voltages. Accordingly, oscillator circuits of embodiments of the present invention operate to provide a self-oscillating circuit which provides non-overlapping trigger signal output having a relatively constant duty cycle over a large range of operating voltages.

Oscillator circuit configurations of the present invention do not require programmed delays or complex delay tuning circuits, and thus avoid the disadvantages associated with such circuits. Accordingly, oscillator circuits of the present invention operate reliably at very low voltages, such as 0.6 Volts in a CMOS implementation, thereby facilitating their use even in the startup of boost and buck-boost DC-DC converter circuits. Moreover, oscillator circuits of the present invention may be implemented using little physical space (e.g., die area) and at little cost.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the all that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention reference is now made to the following descriptions taken in conjunction with the accompanying drawings in which;

FIG. 1A shows a NOR type reset-set flip-flop circuit useful according to an embodiment of the invention;

FIG. 1B shows a NAND type reset-set flip-flop circuit useful according to an embodiment of the invention;

FIGS. 2A and 2B show timing diagrams for the flip-flop circuits of FIGS. 1A and 1B;

FIG. 3A shows a NOR type reset-set flip-flop circuit of FIG. 1A having feedback delay circuits disposed in the cross-coupled signal path according to an embodiments of the invention;

FIG. 3B shows a NAND type reset-set flip-flop circuit of FIG. 1B having feedback delay circuits disposed in the cross-coupled signal path according to an embodiment of the invention;

FIGS. 4A and 4B show the feedback signal path of an embodiment of the flip-flop circuit of FIG. 3A for different input signal levels;

DETAILED DESCRIPTION OF THE INVENTION

Figure 5A:
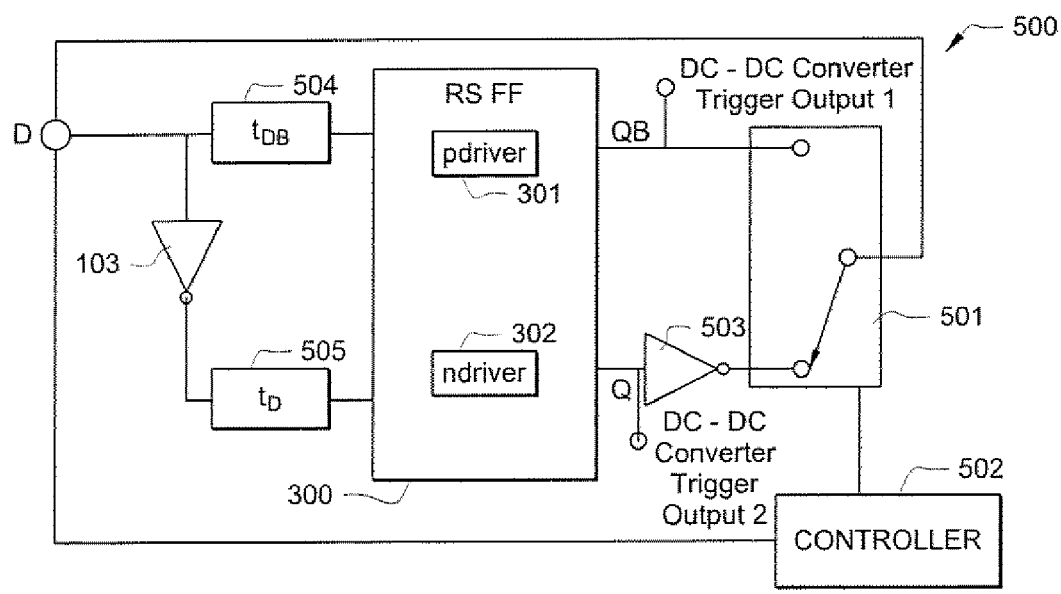
FIG. 5A shows a reset-set flip-flop type oscillator circuit having feedback control according to an embodiment of the invention.

In arriving at the present invention, it was realized that in order to provide reliable and accurate voltage conversion, oscillators used in DC-DC voltage converters should meet several operational criteria. Specifically, such oscillators should provide stable self oscillation, the oscillation providing synchronized or non-overlapping trigger signal output, and the duty cycle of the oscillation should be constant. The various oscillator circuits which have previously been proposed for use in DC-DC converters were found to provide unsatisfactory performance with respect to one or more of the foregoing operational criteria. Moreover, many of the previous oscillator circuits are complex, costly, and/or require appreciable physical space (e.g., requiring an undesirable amount of integrated circuit die space).

Directing attention to FIGS. 1A, 1B, 2A, and 2B, it can be seen that RS flip-flop circuit configurations may be utilized to provide non-overlapping trigger signal output. As can be seen in FIG. 1A, NOR type RS flip-flop circuit configuration 100A includes NOR gates 101A and 102A cross coupled to provide an RS flip-flop circuit. NAND type RS flip-flop circuit configuration 100B includes NAND gates 101B and 102B cross coupled to provide an RS flip-flop circuit as shown in FIG. 1B. In each of the foregoing RS flip-flop circuit configurations inputs R and S are coupled together by an inverter (inverter 103A in FIG. 1A, and inverter 103B in FIG. 1B0, such that when a signal at input R is high a signal at input S is low.

NOR type RS flip-fop circuit configuration 100A provides non-overlapping high output signals levels at outputs QB and Q as shown in FIG. 2A. As can be seen in the timing diagram of FIG. 2A, when input D is low (i.e., R is low and S is high), output QB is high and Q is low, and when input D is high (i.e., R is high and S is low), output QB is low and Q is high. Of particular interest with respect to the non-overlapping trigger signal output aspect of the circuit is the fact that during the transitions where input D goes from low to high and from high to low, outputs QB and Q are never both high at the same time, as shown in regions 201A-203A of FIG. 2A. Accordingly, high level output at outputs QB and Q of RS flip-flop circuit configuration 100A may be utilized as a non-overlapping trigger signal.

Similarly, NAND type RS flip-flop circuit configuration 100B provides non-overlapping low output signal levels at outputs QB and Q as shown in FIG. 2B. As can be seen in the timing diagram of FIG. 2B, when input D is low (i.e., R is low and S is high), output QB is high and Q is low, and when input D is high (i.e., R is high and S is low), output QB is low and Q is high. During the transitions where input D goes from low to high and from high to low, outputs QB and Q are never both low at the same time, as shown in regions 201B-203B of FIG. 2B. Accordingly, low level output at outputs QB and Q of RS flip-flop circuit configuration 100A may be utilized as a non-overlapping trigger signal.

The foregoing non-overlapping trigger signal output characteristic is provided by the cross-coupled circuit configuration of the above NOR type (FIG. 1A) and NAND type (FIG. 1B) implementations. Although providing excellent non-overlapping output signal characteristics, the foregoing RS flip-flop circuit configurations are not operable to provide self-oscillation with constant duty cycle, and thus are not suitable for use as a DC-DC converter startup oscillator circuit.

Directing attention to FIGS. 3A and 3B, RS flip-flop circuit configurations which may be made to be self-oscillating, and which continue to provide non-overlapping trigger signal output, are shown. Specifically, NOR type RS flip-flop circuit configuration 300A of the embodiment illustrated in FIG. 3A includes feedback delay circuits, pdriver 301A and ndriver 302A, in the cross-coupled signal path of NOR gates 101A and 102A. Similarly, NAND type RS flip-flop circuit configuration 300B of the embodiment illustrated in FIG. 3B includes feedback delay circuits, pdriver 301B and ndriver 302B, in the cross-coupled signal path of NAND gates 101B and 102B. Pdrivers 301A and 301B and ndrivers 302A 302B of embodiments are output buffers, such as may comprise an operational amplifier configured as a buffer amplifier, providing buffering of the output signals (QB and Q) as well as introducing a delay (such as in the range of 10-100 nsec) into the signal path. The delay introduced into the signal path by pdrivers 301A and 301B (pdriver delay=$t_{PD}$) and ndrivers 302A and 302B (ndriver delay=$t_{ND}$) alone, or in combination with other delays associated with the signal path (such as input delay circuits described below), provides signal delay sufficient to provide self-oscillation of the RS flip-flop circuit configuration in which they are disposed, as described further below.

Although the above described embodiment of the invention may utilize buffer amplifiers as feedback delay circuits, alternative embodiments of the invention may utilize a variety of other circuits, provided such circuits provide sufficient delay to provide self-oscillation of an RS flip-flop circuit configuration as described herein. For example, embodiments of the invention may utilize resistor and capacitor circuits, delay lines, active devices, etc. with respect to any of pdrivers 301A or 301B or ndrivers 302A or 302B.

In order to provide a self-oscillating circuit, an output (i.e., QB or Q) of NOR type RS flip-flop circuit configuration 300A, or similarly an output of NAND type RS flip-flop circuit configuration 300B, is fed back to the input (i.e., D). FIGS. 4A and 4B show output QB being fed back to input D for self-oscillation of NOR type RS flip-flop circuit configuration 300A. The signal will take the shortest path to complete the circuit. Accordingly, as shown by the dotted line in FIG. 4A, the feed-back signal will include delay introduced by pdriver 301A and not that introduced by ndriver 302A when the input signal at D is high. However, as shown by the dotted line in FIG. 4B, the feed-back signal will include delays introduced by both pdriver 301A and ndriver 302A when the input signal at D is low. Similar results (introducing different amounts of delay when the input signal is high and low) are realized when output Q is fed back to input D in NOR type RS flip-flop circuit configuration 300A and when either output QB or output Q are fed back to input D in NAND type RS flip-flop circuit configuration 300B.

Although the introduction of different amounts of delay when the input signal is high and low will not prevent the circuit from self-oscillating, provided the individual delay (e.g., the delay introduced by pdriver 301A in the circuit configuration of FIG. 4A) is sufficient to provide oscillation, this operation will typically be unsatisfactory for an oscillator circuit outputting trigger signals for controlling a DC-DC converter. That is, the delays introduced by the delay circuitry (e.g., pdrivers 301A and 301B and ndrivers 302A and 302B) will likely vary with operating conditions, such as operating voltage, temperature, age, etc. Moreover, the variations in delays provided by a pair of corresponding delay circuits (e.g., pdriver 301A and ndriver 302A or pdriver 301B and ndriver 302B) are unlikely to parallel each other. As the delay provided by one of the corresponding delay circuits begins to dominate, such as due to supply voltage sag, the outputs QB and Q become unsynchronized, and thus the circuit cannot be relied upon to provide non-overlapping trigger signals needed for DC-DC conversion.

Embodiments of the present invention provide a feedback control circuit to ensure that the delay associated with any one delay circuit does not solely provide the feedback delay. Accordingly, control circuitry of embodiments provides feedback control such that the signal being fed back propagates through each of a plurality of output driver buffers and thus the oscillator circuit continues to provide non-overlapping trigger signal output throughout a large range of operating voltages. Including delay associated with each such driver buffer according to embodiments of the invention operates to negate any differences in the variations of each such buffer driver over the range of operating conditions experienced. That is, embodiments of the invention are thus self-calibrating to the differences in feedback delay to provide non-overlapping trigger signal output. Thus, embodiments of the present invention are able to operate reliably and predictably over a range of operating conditions without complex and costly programmed delays or complex delay tuning circuits.

Directing attention to FIG. 5A, RS flip-flop type oscillator circuit 500 adapted according to an embodiment of the invention for outputting non-overlapping trigger signals for controlling a DC-DC converter is shown. RS flip-flop circuit 300 may comprise any suitable RS flip-flop type circuitry, such as that of NOR type RS flip-flop circuit configuration 300A of FIG. 3A or NAND type RS flip-flop circuit configuration 300B of FIG. 3B. RS flip-flop type oscillator circuit 500 includes switching circuitry 501, preferably comprising solid state switches (e.g., transistors) although other switching means (e.g., physically switched contacts) may be used, operating tinder control of controller 502, preferably comprising control logic such as in the form of application specific integrated circuits or a general purpose processor. Switching, circuitry 501 of a preferred embodiment comprises a multiplexer (MUX) operating under control of controller 502. Controller 502 of the illustrated embodiment is coupled to input D so as to detect the input signal state (e.g., high or low) and control switching circuitry 501 to couple an appropriate one of outputs QB and Q to input D for oscillation feedback. That is, controller 502 of the illustrated embodiment monitors input D to control switching circuitry 501 such that the signal fed back from the output (either QB or Q) to input D for oscillation includes delays introduced by both pdriver 301 and ndriver 302.

It should be appreciated that inverter 503 is provided between output Q and switching circuitry 501 to provide a feedback signal level corresponding to that provided by output QB. That is, outputs QB and Q are inverted with respect to one another, and thus to use the output of Q in combination with the output of QB for feedback oscillation one or the other feedback signals is inverted.

Figure 6A:
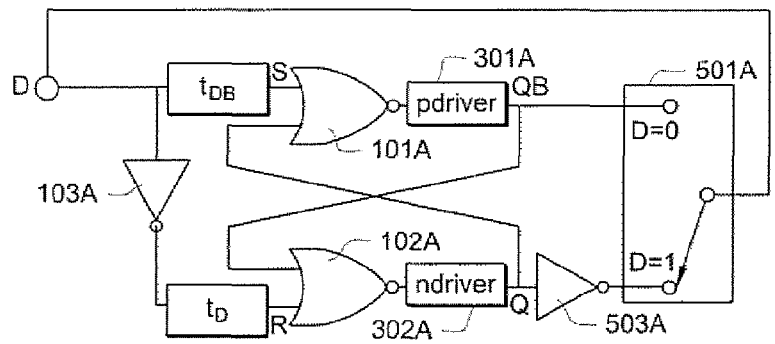
FIG. 6A shows a NOR type reset-set flip-flop circuit of FIG. 3A having feedback control of FIG. 5A therewith according to an embodiment of the invention.
Figure 6B:
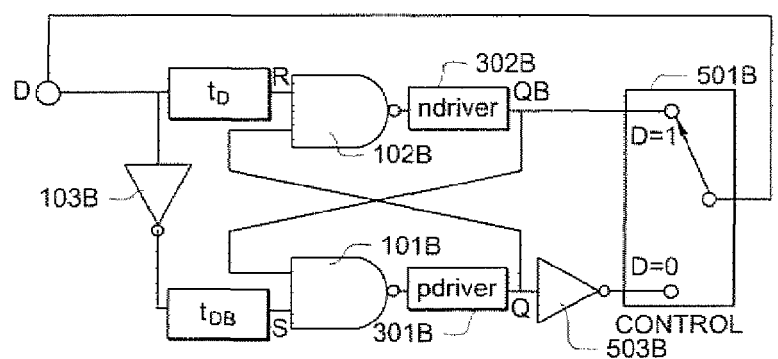
FIG. 6B shows a NAND type reset-set flip-flop circuit of FIG. 3B having feedback control of FIG. 5A therewith according to an embodiment of the invention.

Directing attention to FIGS. 6A and 6B, detail with respect to particular RS flip-flop circuit embodiments of the RS flip-flop type oscillator circuit of FIG. 5A is shown. Specifically, FIG. 6A shows NOR type RS flip-flop oscillator circuit configuration 600A and FIG. 6B shows NAND type RS flip-flop oscillator circuit configuration 600B. Switching circuitry 501A and 501B and inverters 503A and 503B correspond to switching circuitry 501 and inverter 503 of FIG. 5A. Although not shown for simplification, NOR type RS flip-flop oscillator circuit configuration 600A and NAND type RS flip-flop oscillator circuit configuration 600B preferably include controller circuitry, such as controller 502 of FIG. 5A, coupled to switching circuitry 501A and 501B to provide control as described herein.

Figure 7A:
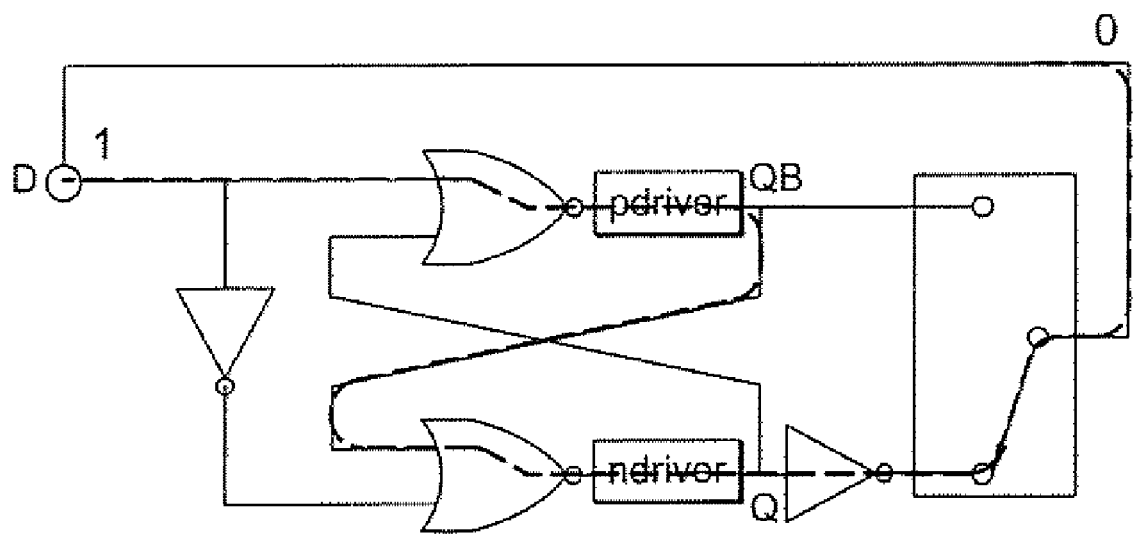
FIGS. 7A and 7B show operation of the feedback control of FIG. 6A according to an embodiment of the invention.
Figure 7B:
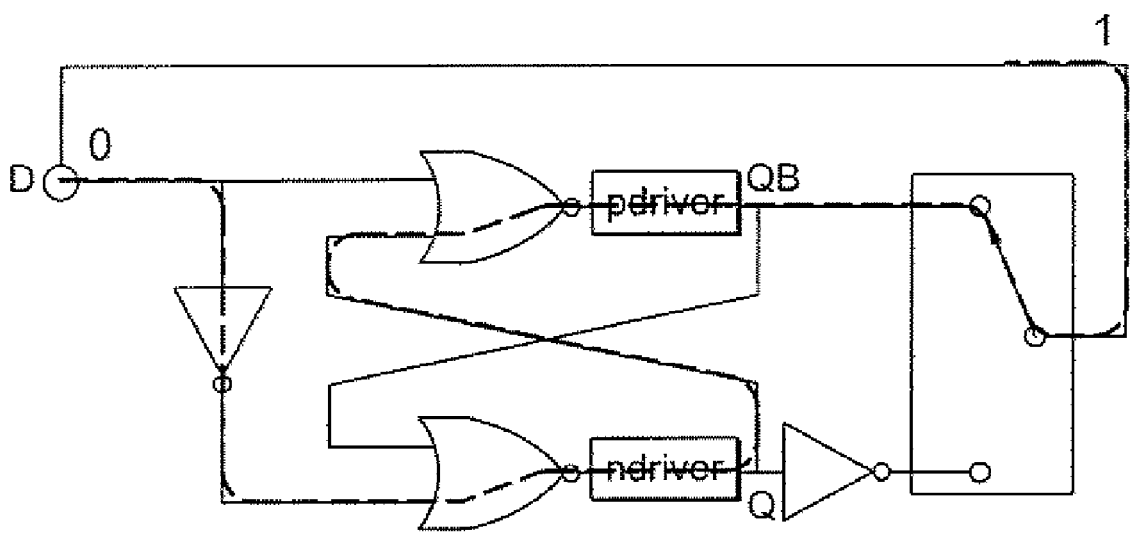

As can be seen in FIG. 6A, switching circuitry 501A of NOR type RS flip-flop oscillator circuit configuration 600A is preferably controlled to feedback the signal at output Q when input D is high and to feedback the signal at output QB when input D is low. As can be appreciated from the discussion of FIGS. 4A and 4B above, such control of the feedback signal results in the delays associated with both pdriver 301A and ndriver 302A being introduced into the feedback signal both when input D is high and low. This is illustrated by the dotted lines in FIGS. 7A and 7B.

Switching circuitry 501B of NAND type RS flip-flop oscillator circuit configuration 600B is preferably controlled to feedback the signal at output QB when input D is high and to feedback the signal at output Q when input D is low, as shown in FIG. 6B. Again, it can be appreciated from the discussion of FIGS. 4A and 4B that such control of the feedback signal results in the delays associated with both pdriver 301B and ndriver 302B being introduced into the feedback signal both when input D is high and low.

The foregoing has described an oscillator circuit configuration which is self-oscillating and which provides non-overlapping trigger signal output. However, due to the variations in delay provided by the delay circuits (in the above embodiments pdriver 301 and ndriver 302) over the operating conditions of the circuit (e.g. voltage changes), the duty cycle of the trigger signals output may vary appreciably. That is, the period of time that a signal at output Q is high will not remain at a constant ratio with the time that a signal at output QB is high as the delays introduced by the delay circuits vary. However, in providing trigger signals used for DC-DC conversion it is desirable to have constant or relatively constant trigger signal duty cycles in order to provide consistent and predictable DC-DC conversion circuit output voltages.

Figure 5B:
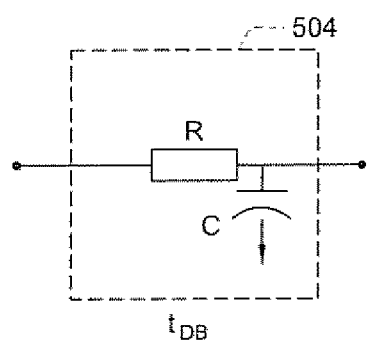
FIGS. 5B-5G show various embodiments of delay circuits as may be used in the oscillator circuit of FIG. 5A.
Figure 5C:
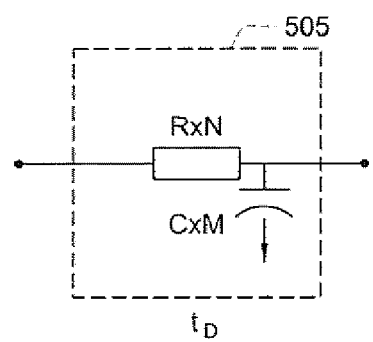

Accordingly, embodiments of the invention implement input delay circuitry adapted to maintain a relatively constant reset and set input feedback delay ratio throughout the range of operating conditions. Referring again to FIG. 5A, input delay circuits 504 and 505 are provided at the input of RS flip-flop circuit 300. Input delay circuits 504 and 505 are preferably adapted to provide delays ($t_{DB}$ and $t_D$) which remain in a constant, or relatively constant, ratio throughout all operating conditions in the range of operating conditions. For example, input delay circuits 504 and 505 may implement capacitors, the operation of which remain unaffected by operating voltage, to provide constant ratio delays between input delay circuits 504 and 505 throughout a range of operating voltages. FIGS. 5B and 5C show embodiments of delay circuits 504 and 505 wherein resistor and capacitor circuits are implemented according to an embodiment of the present invention. The delay ratio provided by delay circuits 504 and 505 of FIGS. 5B and 5C may be represented according to the following equation:

$$\frac{t_{DB}}{t_D} = \frac{RC}{(N \times R)(M \times C)} \quad (1)$$

The particular circuit configurations and components of delay circuits 504 and 505 of FIGS. 5B and 5C are preferably selected to provide the foregoing ratio which remains constant, or relatively constant, throughout all operating conditions in the range of operating conditions.

Figure 5D:
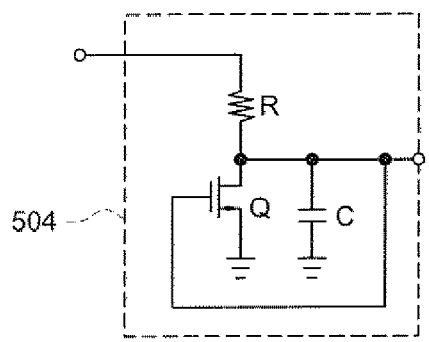
Figure 5E:
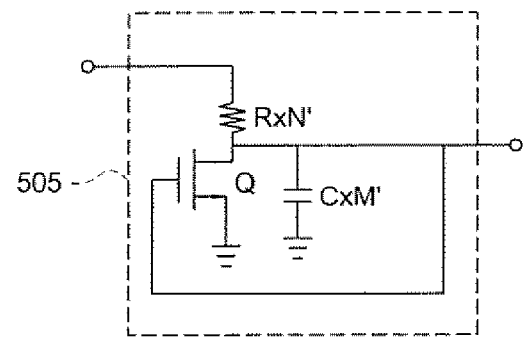
Figure 5F:
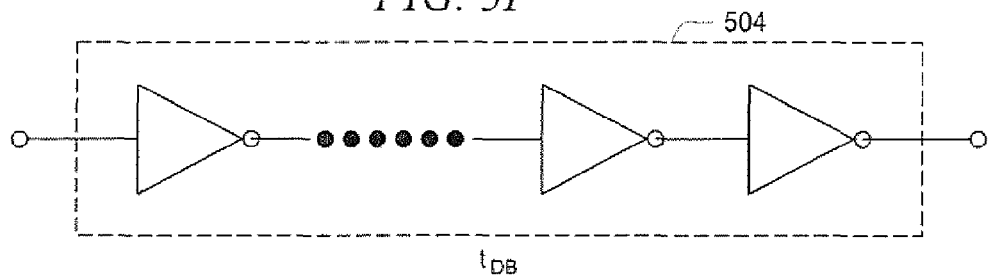
Figure 5G:
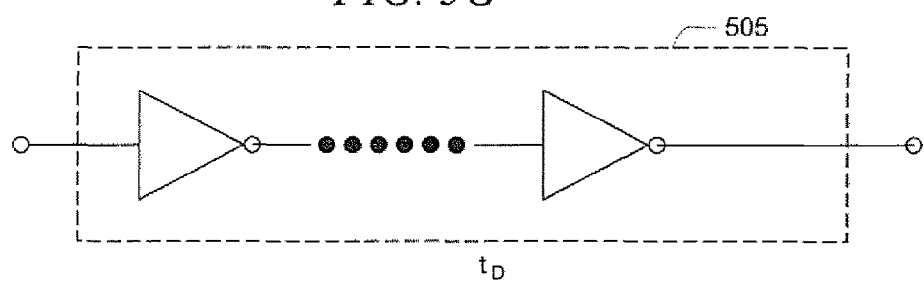

Circuit configurations and components in addition to or in the alternative to those illustrated in the embodiment of FIGS. 5B and 5C may be utilized to provide delays according to embodiments of the invention. For example, FIGS. 5D and 5E show embodiments of delay circuits 504 and 505 wherein active devices are utilized. FIGS. 5F and 5G show embodiments of delay circuits 504 and 505 wherein delay lines (here using a series of delay buffers) are utilized.

According to a preferred embodiment, input delay circuits 504 and 505 provide delays (delay circuit 504 delay=$t_{DB}$ and delay circuit 505 delay=$t_D$) that dominate the delays ($t_{PD}$ and $t_{ND}$) provided by the feedback delay circuits at all operating conditions in a range of operating conditions (e.g., throughout the range of operating voltages). Dominate as used herein means that the dominating delay is greater than the non-dominating delay by an amount sufficient to render the dominating delay controlling. The duty cycle or delay ratio resulting from delays provided according to the illustrated embodiment may be expressed as:

$$\text{Duty cycle (delay ratio)} = \frac{t_D + (t_{PD} + t_{ND})}{t_{DB} + t_D + (t_{PD} + t_{ND}) \times 2} \quad (2)$$

If it is assumed that the supply voltage variation (e.g., voltage sag due to depletion of the battery or aging of the battery) is longer than the oscillator frequency, $t_{PD}$ and $t_{ND}$ will be similar. Therefore, the duty cycle or delay ratio set forth in equation (2) may be simplified as:

$$\text{Duty cycle (delay ration)} \approx \frac{t_D + (t_{PD} \times 2)}{t_{DB} + t_D + (t_{PD} \times 4)} \qquad (3)$$

Figure 9:
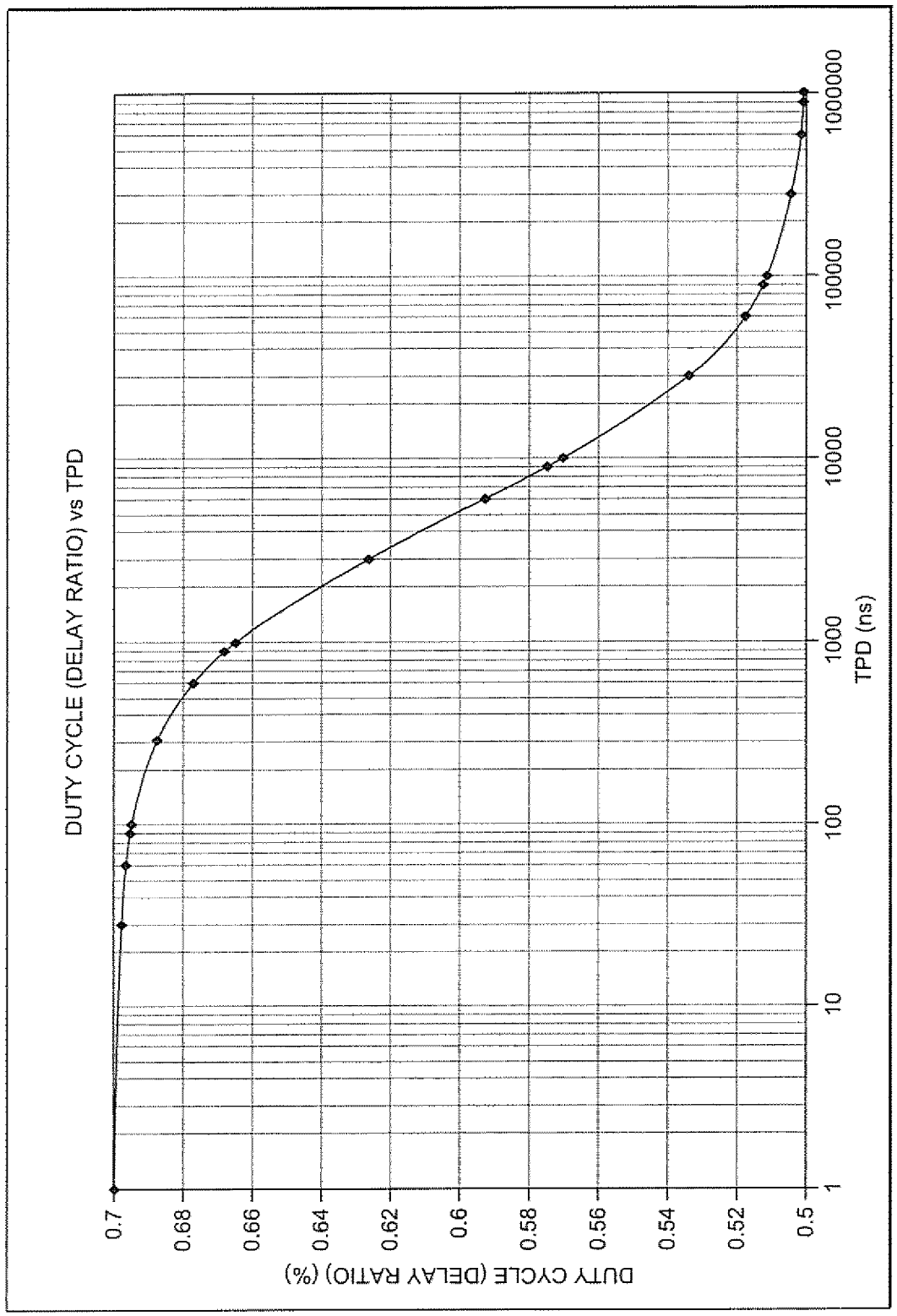
FIG. 9 shows a graph of duty cycle verses feedback delay according to an exemplary embodiment.

From the foregoing, it can be appreciated that, when $t_{PD}$ is dominated, the minimum ditty cycle is 50%. As $t_{PD}$ becomes insignificant, the duty cycle will depend almost exclusively on the ratio of $t_D$ and $t_{DB}$. For example, assume that the target duty cycle is 70%, the target frequency is 500 KHz (2000 ns), $t_D$ is 1,400 ns, $t_{DB}$ is 600 ns, and $t_{PD}=t_{ND}$. By changing the delay of $t_{PD}$ from 0 ns to 1,000,000 ns (1 ms) in log scale, the minimum duty cycle remains 50%. This relationship is illustrated in the graph of FIG. 9.

Figure 8A:
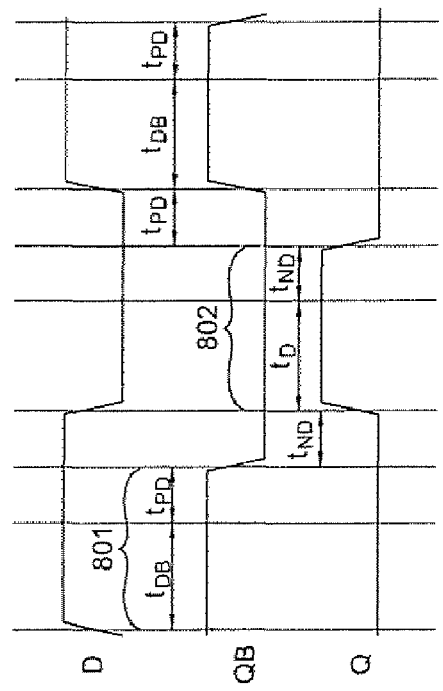
FIGS. 8A, 8B, 8C, and 8D show the introduction of delays and timing of signals in a NAND type reset-set flip-flop circuit of an embodiment of the invention.
Figure 8B:
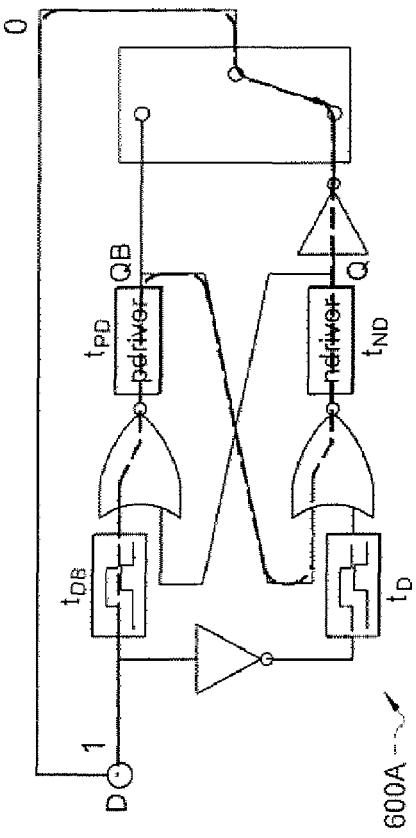
Figure 8C:
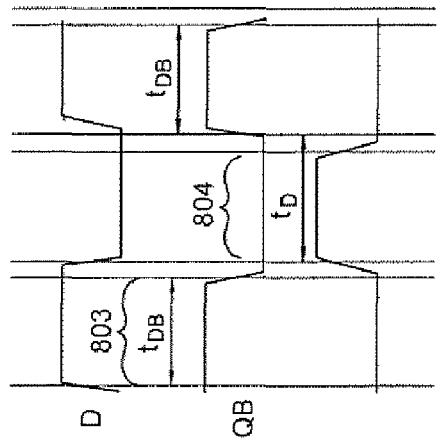
Figure 8D:
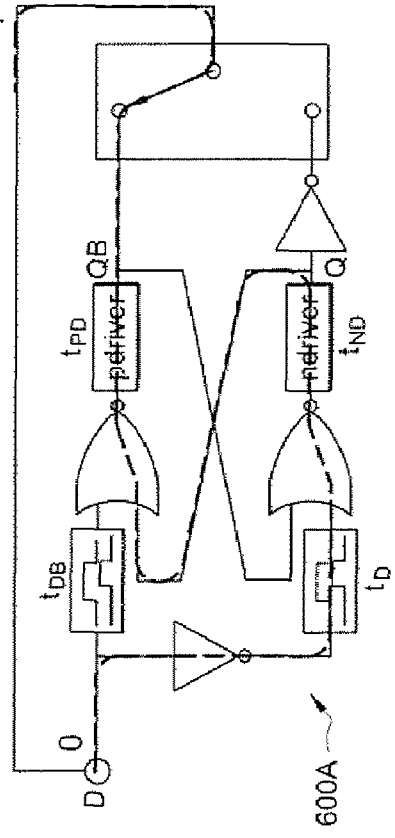

The providing of constant duty cycle trigger signal output according to the foregoing is shown in FIGS. 8A-8D. Specifically, FIG. 8A shows the delays introduced in type RS flip-flop oscillator circuit configuration 600A when input D is high. The corresponding representative timing diagram illustrated in FIG. 8B shows that the duty cycle of the output trigger signals QB and Q remains constant, as shown by high output times 801 and 802. FIG. 8C shows the delays introduced in type RS flip-flop oscillator circuit configuration 600A when input D is low. The corresponding representative timing diagram illustrated in FIG. 8D shows that the duty cycle of the output trigger signals QB and Q remains constant (it being appreciated that $t_{PD}$ and $t_{ND}$ are insignificant), as shown by high output times 803 and 804.

From the above, it should be appreciated that the illustrated embodiment of RS flip-flop type oscillator circuit 500 operates to provide a self-oscillating circuit which provides non-overlapping trigger signal output having a relatively constant duty cycle over a large range of operating voltages. Accordingly, RS flip-flop type oscillator circuits of embodiments of the present invention provides a oscillator circuit for use in a DC-DC converter to provide consistent and predictable voltage conversion. Moreover, RS flip-flop type oscillator circuits as described herein may be operated reliably at very low voltages, such as 0.6 Volts in a CMOS implementation, thereby facilitating its use even in the startup of boost and buck-boost DC-DC converter circuits. Additionally, RS flip-flop type oscillator circuits of embodiments of the invention may be implemented using little physical space (e.g., die area) and at little cost.

Although embodiments of the invention have been described herein with reference to the use of the oscillator circuits in DC-DC converters, it should be appreciated that RS flip-flop type oscillator circuits of the present invention may be utilized in a number of different applications. For example, oscillator circuits as described herein may be utilized in various timing circuits, such as charge pumps, buck-boost converters, etc.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. System comprising:
a reset-set flip-flop circuit having cross-coupled signal paths coupling circuit elements of said reset-set flip-flop circuit, said reset-set flip-flop circuit having at least one input and a plurality of outputs;
a first delay circuit disposed in a first one of said cross-coupled signal paths, said first delay circuit providing a first signal delay; and
a second delay circuit disposed in a second one of said cross-coupled signal paths, said second delay circuit providing a second signal delay, wherein said first and second signal delays are selected to combine to provide self-oscillation of said reset-set flip-flop circuit throughout a desired range of operating voltages when said outputs are fed back to said input.

2. The system of claim 1, further comprising:
a controllable switching circuit coupled between said plurality of outputs and said input to provide controlled feedback of signals output at each of said plurality of outputs to said input.

3. The system of claim 2, further comprising:
a controller coupled to said controllable switching circuit and said input, said controller operable to monitor a signal at said input and control said controllable switching circuit in response thereto.

4. The system of claim 2, further comprising:
a controller coupled to said controllable switching circuit, said controller operable to control said switching circuit so that a signal fed back to said input always includes said first signal delay and said second signal delay.

5. The system of claim 1, further comprising:
a plurality of input delay circuits disposed in signal paths coupled to said at least one input, said plurality of input delay circuits each providing an input delay, wherein said input delays are selected to maintain a constant ratio with respect to one another throughout said desired range of operating voltages.

6. The system of claim 5, wherein said input delays are selected to be greater than the first signal delay and the second signal delay at all voltages of said desired range of operating voltages.

7. The system of claim 1, wherein said circuit elements comprise:
a plurality of cross-coupled NOR gates.

8. The system of claim 1, wherein said circuit elements comprise:
a plurality of cross-coupled NAND gates.

9. The system of claim 1, wherein said first delay circuit and said second delay circuit each comprise a buffer circuit.

10. The system of claim 9, wherein said buffer circuits each comprise an operational amplifier.

11. A system comprising:
a reset-set flip-flop circuit having cross-coupled signal paths coupling circuit elements of said reset-set flip-flop circuit, said reset-set flip-flop circuit having at least one input and a plurality of outputs;
a first delay circuit disposed in a first one of said cross-coupled signal paths, said first delay circuit providing a first signal delay;
a second delay circuit disposed in a second one of said cross-coupled signal paths, said second delay circuit providing a second signal delay, wherein said first and second signal delays vary differently with respect to voltages in a desired range of operating voltages; and a controllable switching circuit coupled between said plurality of outputs and said input to provide controlled feedback of signals output at each of said plurality of outputs to said input.

12. The system of claim 11, further comprising:

a controller coupled to said controllable switching circuit and said input, said controller operable to monitor a signal at said input and control said controllable switching circuit in response thereto.

13. The system of claim 11, further comprising:

a controller coupled to said controllable switching circuit, said controller operable to control said switching circuit so that a signal fed back to said input always includes said first signal delay and said second signal delay.

14. The system of claim 11, wherein said first and second signal delays are selected to combine to provide self-oscillation of said reset-set flip-flop circuit throughout said desired range of operating voltages.

15. The system of claim 11, further comprising:

a plurality of input delay circuits disposed in signal paths coupled to said at least one input, said plurality of input delay circuits each providing an input delay, wherein said input delays are selected to maintain a constant ratio with respect to one another throughout said desired range of operating voltages.

16. The system of claim 15, wherein said input delays are selected to be greater than the first signal delay and the second signal delay at all voltages of said desired range of operating voltages.

17. A method comprising:

disposing a first delay circuit in a first cross-coupled signal path of a reset-set flip-flop circuit;

disposing a second delay circuit in a second cross-coupled signal path of said reset-set flip-flop circuit;

coupling a controllable switching circuit between first and second outputs of said reset-set flip-flop circuit and an input of said reset-set flip-flop circuit, wherein said input of said reset flip-flop circuit feeds a first input signal path of said reset-set flip-flop circuit and a second input signal path of said reset-set flip-flop circuit; and controlling said controllable switching circuit to select a particular one of said first and second outputs for feedback to said input so that a feedback signal always includes a delay provided by said first delay circuit and a delay provided by said second delay circuit.

18. The method of claim 17, further comprising:

disposing a first input delay circuit in said first input signal path of said reset-set flip-flop circuit;

disposing a second input delay circuit in said second input signal path of said reset-set flip-flop circuit, wherein said first input delay circuit and said second input delay circuit are selected to provide a constant delay ratio with respect to each other throughout a desired operating voltage range.

19. The method of claim 18, wherein said first input delay circuit and said second input delay circuit are disposed within a feedback loop defined by said controllable switching circuit coupled to said first and second outputs and said input.

20. The method of claim 17, further comprising:

outputting non-overlapping trigger signals in accordance with switching of said controllable switching circuit.

21. The method of claim 20, further comprising:

providing said non-overlapping trigger signals to a voltage converter circuit.

\* \* \* \* \*